United States Patent
Zhang

[11] Patent Number: 5,922,125
[45] Date of Patent: Jul. 13, 1999

[54] SEMICONDUCTOR DEVICE AND METHOD OF MANUFACTURING THE SAME

[75] Inventor: Hongyong Zhang, Kanagawa, Japan

[73] Assignee: Semiconductor Energy Laboratory Co., Ltd., Kanagawa-ken, Japan

[21] Appl. No.: 08/763,225

[22] Filed: Dec. 10, 1996

[30] Foreign Application Priority Data

Dec. 12, 1995 [JP] Japan .................................. 7-346702

[51] Int. Cl.⁶ ............................................ H01L 29/04
[52] U.S. Cl. .................................... 117/9; 117/10
[58] Field of Search .......................................... 117/9, 10

[56] References Cited

U.S. PATENT DOCUMENTS

| | | | |
|---|---|---|---|
| 5,147,826 | 9/1992 | Liu et al. | 437/233 |
| 5,275,851 | 1/1994 | Fonash et al. | 427/578 |
| 5,403,772 | 4/1995 | Zhang et al. | 437/101 |
| 5,426,064 | 6/1995 | Zhang et al. | 437/40 |
| 5,481,121 | 1/1996 | Zhang et al. | 257/64 |
| 5,488,000 | 1/1996 | Zhang et al. | 437/21 |
| 5,492,843 | 2/1996 | Adachi et al. | 437/21 |
| 5,501,989 | 3/1996 | Takayama et al. | 437/21 |
| 5,508,533 | 4/1996 | Takemura | 257/64 |
| 5,529,937 | 6/1996 | Zhang et al. | 437/10 |
| 5,534,716 | 7/1996 | Takemura | 257/72 |
| 5,543,352 | 8/1996 | Ohtani et al. | 437/101 |
| 5,563,426 | 10/1996 | Zhang et al. | 257/66 |
| 5,569,610 | 10/1996 | Zhang et al. | 437/21 |
| 5,569,936 | 10/1996 | Zhang et al. | 257/66 |
| 5,580,792 | 12/1996 | Zhang et al. | 437/10 |
| 5,585,291 | 12/1996 | Ohtani et al. | 437/40 |
| 5,589,694 | 12/1996 | Takayama et al. | 257/67 |
| 5,595,923 | 1/1997 | Zhang et al. | 437/41 |
| 5,595,944 | 1/1997 | Zhang et al. | 437/41 |
| 5,604,360 | 2/1997 | Zhang et al. | 257/72 |
| 5,605,846 | 2/1997 | Ohtani et al. | 437/21 |
| 5,606,179 | 2/1997 | Yamazaki et al. | 257/59 |
| 5,608,232 | 3/1997 | Yamazaki et al. | 257/66 |
| 5,612,250 | 3/1997 | Ohtani et al. | 437/101 |
| 5,614,426 | 3/1997 | Funada et al. | 437/40 |
| 5,614,733 | 3/1997 | Zhang et al. | 257/66 |
| 5,616,506 | 4/1997 | Takemura | 438/150 |
| 5,620,910 | 4/1997 | Teramoto | 438/151 |
| 5,621,224 | 4/1997 | Yamazaki et al. | 257/66 |
| 5,624,851 | 4/1997 | Takayama et al. | 438/166 |
| 5,637,515 | 6/1997 | Takemura | 438/162 |
| 5,639,698 | 6/1997 | Yamazaki et al. | 437/228 |
| 5,643,826 | 7/1997 | Ohtani et al. | 437/88 |
| 5,646,424 | 7/1997 | Zhang et al. | 257/66 |
| 5,654,203 | 8/1997 | Ohtani et al. | 438/97 |
| 5,656,825 | 8/1997 | Kusumoto et al. | 257/66 |
| 5,663,077 | 9/1997 | Adachi et al. | 438/151 |
| 5,677,549 | 10/1997 | Takayama et al. | 257/66 |
| 5,696,386 | 12/1997 | Yamazaki | 257/57 |
| 5,696,388 | 12/1997 | Funada et al. | 257/64 |
| 5,700,333 | 12/1997 | Yamazaki et al. | 136/258 |
| 5,705,829 | 1/1998 | Miyanaga et al. | 257/66 |
| 5,712,191 | 1/1998 | Nakajima et al. | 437/174 |

*Primary Examiner*—R. Bruce Breneman
*Assistant Examiner*—A. Alanko
*Attorney, Agent, or Firm*—Fish & Richardson P.C.

[57] ABSTRACT

In order to obtain a thin-film transistor having high characteristics using a metal element for accelerating the crystallization of silicon, a nickel element is selectively added to the surface of an amorphous silicon film (103) in regions (101) and (102) and regions (108) to (110), and a heat treatment is carried out to grow crystals (horizontal growth) in directions parallel to the substrate as indicated by arrows (104) to (107). At this point, the regions (108) to (110) having a width of 5 μm or less serve as stopper regions so that horizontal growth starting from the regions (101) and (102) stops there. In this way, the horizontal growth regions can be formed with high controllability. Then a circuit such as a shift register can be constructed with a region having the same crystal growth form.

5 Claims, 8 Drawing Sheets

SEMICONDUCTOR DEVICE AND METHOD OF MANUFACTURING THE SAME

BACKGROUND OF THE INVENTION

1. Field of the Invention

The present invention relates to a semiconductor device using a crystalline silicon film, and to a method of manufacturing the same. More specifically, it is directed to a thin-film transistor using a crystalline silicon film formed on a glass substrate or a quartz substrate, and to a method of manufacturing the same. It also relates to the configuration of a semiconductor device using a crystalline silicon film and to a method of manufacturing the same.

2. Description of the Related Art

Heretofore, there has been known a technology for fabricating a thin-film transistor using a silicon film which is formed on a glass substrate or a quartz substrate by plasma CVD or low-pressure thermal CVD. This technique is utilized not only when a glass substrate or a quartz substrate is used but also when a multi-layer structure is realized in an integrated circuit using a monocrystal silicon wafer.

Studies have been conducted on a technique for using this thin-film transistor in an active matrix type liquid crystal display (LCD) device in particular.

Generally speaking, it is difficult to obtain a monocrystal silicon film by a vapor phase method or deposition method (a technique for forming a monocrystal silicon film on an extremely small region is available but it is not common).

Then, there has been used a technique for forming an amorphous silicon film by plasma CVD or low-pressure thermal CVD and crystallizing the film by heating or irradiating with laser light.

A generally used method for obtaining a crystalline silicon film is a technique for crystallizing an amorphous silicon film formed on a quartz substrate by heat. In this method, heating is carried out at a temperature of 900 to 1,100° C. to modify the amorphous silicon film into a crystalline silicon film.

However, the quartz substrate is expensive and involves a problem when it is used in a liquid crystal display device whose cost reduction has been desired. There is also known a technique in which a glass substrate is used as the substrate. However, since the glass substrate has low heat resistance, it cannot be subjected to the above high-temperature treatment and hence, a required degree of crystallinity cannot be obtained.

The heat resistance temperature of the glass substrate, which differs depending on its type, is in the range of 600 to 750° C. Therefore, it is necessary to obtain a crystalline silicon film having required characteristics through a process at a temperature below that temperature range.

Also, there is known a technique for modifying an amorphous silicon film into a crystalline silicon film by application of laser light. According to this technique, the amorphous silicon film can be modified into a crystalline silicon film without causing thermal damage to the substrate. However, it has problems with the stability of a laser oscillator and uniformity on the illuminated surface. Therefore, it cannot be used on an industrial scale.

As a method for solving the above problem, there is a method in which both a heat treatment and irradiation with laser light are used to increase a process margin. However, when a heat treatment is used, the above treatment temperature problem is encountered, making it difficult to use a glass substrate as well.

As a solution to this problem, there is known a technique disclosed in Laid-open Japanese Patent Application No. Hei 7-074366. This technique uses a metal element for promoting the crystallization of silicon to crystalize an amorphous silicon film at a process temperature of 600° C. or less.

In this technique, there are two crystal growth forms: one is vertical growth (crystal growth in a direction perpendicular to the substrate) which occurs in a region where a metal element is added and the other is horizontal growth (crystal growth in a direction parallel to the substrate) which starts from the region and proceeds around the region.

The vertical growth is characterized in that a crystalline silicon film can be obtained at a lower temperature (crystallizing temperature can be reduced by 50° C.) than heating and that the process is relatively simple. However, since the concentration of the metal element is inevitably high, it has such a problem as the segregation of the metal element.

The segregation of the metal element causes great fluctuations in the characteristic properties of a semiconductor device obtained and an increase in leak current when a thin-film transistor is fabricated.

On the other hand, the horizontal growth is useful because the quality of the resulting film is good and the concentration of the metal element contained therein is low (this means relatively low). However, when a plurality of horizontal growth regions are selectively formed, they may collide with one another, form a grain boundary or impede the growth of crystals in other regions.

Particularly, since a nickel silicide component is formed in the grain boundary, when the region overlaps with the active layer of a thin-film transistor, the characteristic properties of the thin-film transistor are greatly impaired. It has been discovered that the horizontal growth region which is different from the vertical growth region in the dimension of growth is different in crystal growth form, for example, signal strength indicating each crystal orientation, according to X-ray diffraction measurement.

This causes such problems that, when a large number of thin-film transistors must be formed on a substrate, there are the differences of characteristic properties among the thin-film transistors and that, when a circuit is constructed, an operation failure occurs.

Since a circuit configuration will be integrated more and more highly in the future, the collision or interference between the above horizontal growth regions will become a big problem.

When the direction of growth is different, there will be easily produced differences in the characteristic properties of devices obtained. Therefore, when a circuit having a predetermined function is constructed with a plurality of devices, the difference of growth direction will become a problem to be solved.

SUMMARY OF THE INVENTION

An object of the present invention is to obtain the crystal growth regions of a crystalline silicon film with high controllability in a technique for obtaining the crystalline silicon film using a metal element for promoting the crystallization of silicon.

For example, an object of the present invention is to provide a technique for controlling the growth width of a horizontal growth region. Another object of the present invention is to provide a technique for applying a crystal growth technique utilizing the above metal element to a configuration which requires a fine circuit pattern.

According to one aspect of the present invention, a semiconductor device comprising an electronic circuit having at least one function which is formed on a substrate having an insulative surface using a region where crystals are grown in a direction parallel or substantially parallel to the substrate, wherein the region has the same crystal growth form.

In the above configuration, in the region where crystals have grown in a direction parallel or substantially parallel to the substrate, a metal element for promoting the crystallization of silicon is preferably contained in a concentration of $5 \times 10^{15}$ to $1 \times 10^{19}$ cm$^{-3}$, more preferably $1 \times 10^{17}$ to $5 \times 10^{18}$ cm$^{-3}$.

As the metal element for promoting the crystallization of silicon, one or more elements selected from Fe, Co, Ni, Ru, Rh, Pd, Os, Ir, Pt, Cu and Au can be used.

Nickel is particularly useful from viewpoints of effect and reproducibility thereof.

The electronic circuit having at least one function may be an inverter circuit, buffer circuit, switch circuit, decoder circuit, shift register circuit, sampling circuit, sampling hold circuit, flip-flop circuit, other arithmetic circuit or memory circuit. Alternatively, it may be a composite circuit having these functions or a logic circuit such as a NAND circuit or a NOR circuit.

According to another aspect of the invention, a semiconductor device is a display device having an active matrix circuit and a peripheral drive circuit formed on the same substrate having an insulative surface, wherein at least one circuit function constituting the peripheral drive circuit is constructed by using a crystalline silicon film whose crystals are grown in a direction parallel or substantially parallel to the substrate and which has the same crystal growth form.

In the above configuration, the crystalline silicon film whose crystals are grown in a direction parallel or substantially parallel to the substrate and which has the same crystal growth form preferably contains a metal element for promoting the crystallization of silicon in a concentration of $5 \times 10^{15}$ to $1 \times 10^{19}$ cm$^{-3}$.

More preferably, the crystalline silicon film whose crystals are grown in a direction parallel or substantially parallel to the substrate and which has the same crystal growth form contains the metal element for promoting the crystallization of silicon in a concentration of $1 \times 10^{17}$ to $5 \times 10^{18}$ cm$^{-3}$.

At least one circuit function may be an inverter circuit, buffer circuit, switch circuit, decoder circuit, shift register circuit, flip-flop circuit, sampling circuit, sampling hold circuit, other arithmetic circuit or memory circuit. Alternatively, it may be a composite circuit having these functions or a logic circuit such as a NAND circuit or a NOR circuit.

According to another aspect of the invention, a semiconductor device production method comprises the steps of:

selectively holding a metal element for promoting the crystallization of silicon in contact with the front or rear surface of an amorphous silicon film in a plurality of regions;

heating to grow crystals in a direction perpendicular or substantially perpendicular to the surface of the silicon film in the plurality of regions and grow crystals in a direction parallel or substantially parallel to the surface of the silicon film from at least one of the plurality of regions at the same time; and removing the plurality of regions, wherein at least other one of the plurality of regions is used as a stopper for stopping crystal growth in a direction parallel or substantially parallel to the surface of the silicon film to limit the crystal growth in a direction parallel or substantially parallel to the surface of the silicon film.

According to still another aspect of the invention, a semiconductor device production method comprises the steps of:

selectively holding a metal element for promoting the crystallization of silicon in contact with the front or rear surface of an amorphous silicon film in a plurality of regions;

heating to grow crystals in a direction perpendicular or substantially perpendicular to the surface of the silicon film in the plurality of regions and grow crystals in a direction parallel or substantially parallel to the surface of the silicon film from at least one of the plurality of regions at the same time;

removing the plurality of regions; and heating again to grow crystals in a direction parallel or substantially parallel to the surface of the silicon film from the region where crystals are grown in a direction parallel or substantially parallel to the surface of the silicon film.

The position and growth width of a horizontal growth region can be controlled by making use of such a phenomenon that when the horizontal growth region collides with a vertical growth region, it stops growing further.

FIG. 1(A) and FIG. 1(B) show a case where nickel is held in contact with the surface of an amorphous silicon film 103 in regions 101 and 102 and the growth (horizontal growth) of crystals in a direction parallel to a substrate 11 starting therefrom as indicated by arrows 104 to 107 is carried out by heating. The cross section cut on A–A' of FIG. 1(A) is shown in FIG. 1(B).

The growth of crystals as indicated by arrows 104 to 107 in FIG. 1(A) is carried out in directions parallel to the substrate 11 from the regions 101 and 102 where nickel is held in contact with the surface of the amorphous silicon film. In the regions 101 and 102, vertical growth is carried out.

In this respect, the regions 101 and 102 are shaped like a slit having a width of 20 μm or more and a desired length.

What are denoted by 108 to 110 are slit-shaped regions having a width of 5 μm or less which are formed with a mask 14 formed of a silicon oxide film. That is, these regions are slender regions having a width of 5 μm or less, from which the amorphous silicon film 103 is exposed (nickel is held in contact with the surface). Vertical growth is carried out in these regions as well.

In such a configuration, only vertical growth is carried out in the regions denoted by 108 to 110. This is because horizontal growth does not take place when the region which nickel is held in contact with is small.

When the horizontal growth collides with the regions denoted by 108 to 110 where the vertical growth takes place, the horizontal growth stops there. Therefore, the horizontal growth regions formed by horizontal growth and denoted by 104 to 107 can be limited to predetermined regions by suitably providing the regions denoted by 108 to 110.

That is, horizontal growth regions can be obtained with high controllability by using the regions denoted by 108 to 110 as horizontal growth stopper regions.

When crystals are grown such as shown in FIG. 1(A), such a problem that horizontal growth regions collide with each other can be avoided and a large number of thin-film transistors having high and the same characteristic properties can be formed.

It is observed that an end portion of the horizontal growth region generally has a 1-column higher concentration of the metal element for promoting the crystallization of silicon than other portions where the metal element is grown horizontally. It is also observed that the metal element is present in a high concentration in the vertical growth regions.

Therefore, in the regions denoted by 108 to 110 where horizontal growth collides with vertical growth, the metal element (nickel element in this case) is present in an extremely high concentration compared with other regions.

After the completion of crystal growth, the regions containing the metal element in the above high concentration can be removed by dry etching or wet etching using the silicon oxide film 14 of the mask.

It can be said that this step is a step for removing the metal element by concentrating the metal element which has been used for crystal growth in the vertical growth regions denoted by 108 to 110. Although the metal element is useful for the crystallization of a silicon film, it is not preferred in the subsequent steps. Therefore, it can be said that the above configuration is advantageous.

BRIEF DESCRIPTION OF THE INVENTION

The above and other objects and advantages of the present invention will become apparent from the following description with reference to the accompanying drawings, wherein:

FIGS. 1(A) and 1(B) are a diagram showing the state of crystal growth of a crystalline silicon film in accordance with the present invention;

FIG. 2 is a diagram showing the state of crystal growth of a crystalline silicon film and the lay-out of the active layers of thin-film transistors in accordance with the present invention;

FIGS. 3(A) to 3(E) are diagrams showing the production process of a thin-film transistor in accordance with an embodiment of the present invention;

FIGS. 4(A) to 4(E) are diagrams showing the production process of a thin-film transistor in accordance with the embodiment of the present invention;

FIGS. 5(A) to 5(E) are diagrams showing the production process of a thin-film transistor in accordance with another embodiment of the present invention;

FIG. 6 is a diagram showing a circuit pattern in accordance with an embodiment of the present invention; and FIG. 7 is a circuit block diagram of FIG. 6.

DESCRIPTION OF THE PREFERRED EMBODIMENTS

Embodiment 1

This embodiment is directed to a process for fabricating a thin-film transistor using a region for the horizontal growth of a crystalline silicon film formed on a glass substrate.

Figure 1A:
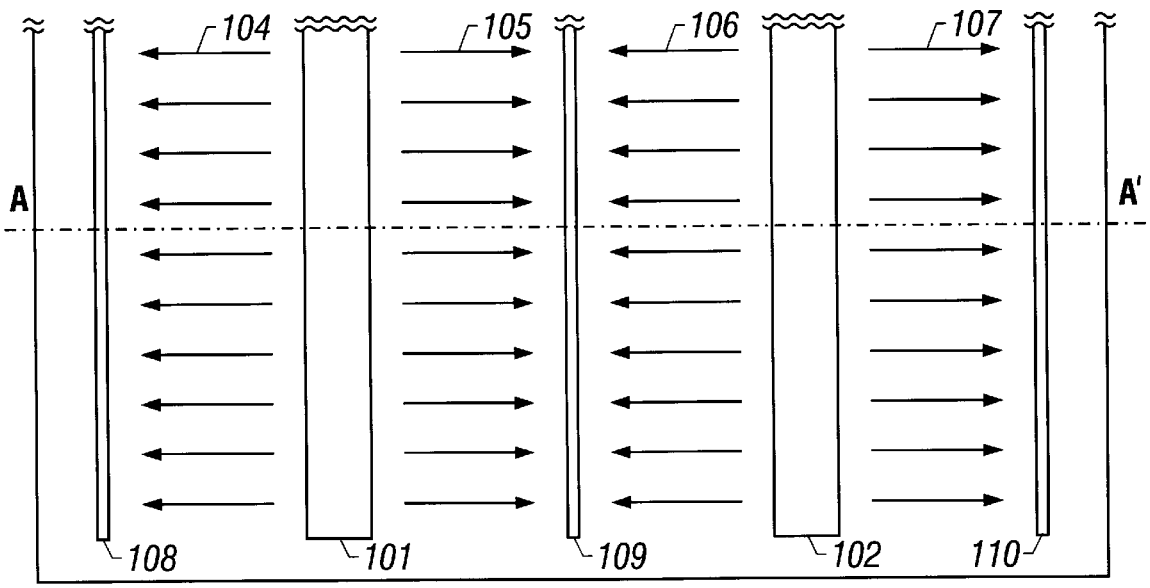
Figure 1B:
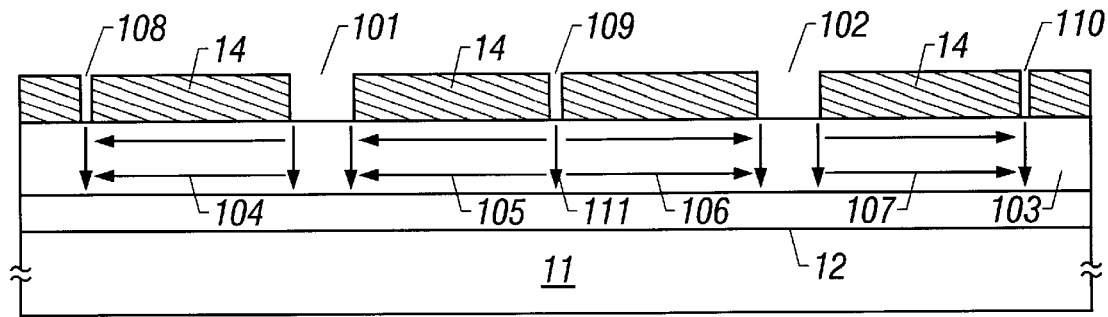

A description is first given of the process for obtaining a crystalline silicon film having horizontal growth regions on the glass substrate with reference to FIG. 1(A) and FIG. 1(B). FIG. 1(B) is a cross section cut on A–A' of FIG. 1(A).

A silicon oxide film or silicon nitride film or silicon oxynitride film is formed on the glass substrate (Corning 1737 glass substrate) 11 as an undercoat film 12 by plasma CVD. This undercoat film should have a thickness of 3,000.

Thereafter, an amorphous silicon film 103 which will become a crystalline silicon film later is formed by plasma CVD or low-pressure thermal CVD.

A silicon oxide film having a thickness of 1,500 Å is formed by plasma CVD and patterning is made on the film to form a mask 14. With this mask 14, slits denoted by 108 to 110 and regions denoted by 101 and 102 are formed. That is, the amorphous silicon film is exposed in the slit regions denoted by 108 to 110 and the regions denoted by 101 and 102 (slender regions as shown in FIG. 1(A)).

In this respect, the regions denoted by 108 to 110 have a width of 5 $\mu$m and the regions denoted by 101 and 102 have a width of 30 $\mu$m.

Preferably, the regions denoted by 108 to 110 have a width of 5 $\mu$m or less. The lower limit of the width is determined by patterning accuracy. Generally speaking, the lower limit is about 0.5 $\mu$m.

Preferably, the regions denoted by 101 and 102 have a width of 20 $\mu$m or more. Since a too large width is disadvantageous to obtain a fine circuit pattern, care must be taken to increase the width. Even when the width is increased to 50 $\mu$m or more, it is no longer connected with the growth distance because the distance of horizontal growth is saturated. Therefore, it is not particularly advantageous to set the widths of the regions denoted by 101 and 102 to 50 $\mu$m or more (the width may be increased to any large value as a matter of course).

The relationship between the width of a region where nickel element is introduced and the amount of horizontal growth ($\mu$m) is shown in Table 1 below.

TABLE 1

| slit width ($\mu$m) | 3 | 5 | 10 | 20 | 50 | 100 | 250 |
|---|---|---|---|---|---|---|---|
| 1  | 0 | 0 | 77–78 | 108–109 | 124–125 | 126–127 | 126–127 |
| 2  | 0 | 0 | 79–81 | 107–108 | 124–128 | 128–130 | 126–127 |
| 3  | 0 | 0 | 87–89 | 113–114 | 125–130 | 129–137 | 126–128 |
| 4  | 0 | 0 | 82–83 | 110–111 | 125–126 | 128–129 | 126–127 |
| 5  | 0 | 0 | 87–88 | 111–112 | 125–130 | 129–130 | 127–128 |
| 6  | 0 | 0 | 87–89 | 113–115 | 130–131 | 130–131 | 128–129 |
| 7  | 0 | 0 | 90–91 | 115–116 | 130–132 | 130–132 | 128–129 |
| 8  | 0 | 0 | 80–81 | 107–108 | 125–129 | 127–128 | 125–126 |
| 9  | 0 | 0 | 86–87 | 112–113 | 124–127 | 129–130 | 126–127 |
| 10 | 0 | 0 | 81–82 | 107–108 | 122–123 | 125–129 | 122–124 |
| 11 | 0 | 0 | 74–75 | 102–104 | 115–116 | 116–117 | 119–120 |
| 12 | 0 | 0 | 62–63 | 89–90 | 105–106 | 107–108 | 106–107 |
| 13 | 0 | 0 | 42–43 | 72–73 | 87–88 | 90–93 | 89–91 |

Table 1 above shows the relationship between the width of a region where nickel element is held in contact (the width of a slender region, e.g., the width of a region denoted by 101 in FIG. 1(A)) and the distance of horizontal growth which starts from this region.

In other words, the above table shows the relationship between the width of the slit-shaped region and the distance of horizontal growth when a silicon oxide mask is provided such that the surface of the amorphous silicon film is exposed in the form of a slit, the nickel element is held in contact with this slit-shaped region and a heat treatment is carried out at 600° C. for 4 hours to grow crystals in a direction (plane direction) parallel to the substrate from the slit-shaped region in which the amorphous silicon film is exposed.

As is evident from Table 1, when the width of the nickel-added region is 5 $\mu$m or less, horizontal growth does not take place. When the width of the nickel-added region is 20 $\mu$m or more, a horizontal growth distance of 100 $\mu$m or more can be obtained. When the width of the nickel-added region is 50 $\mu$m or more, the distance of the obtained horizontal growth is almost saturated.

After the amorphous silicon film 103 is exposed in the regions denoted by 108 to 110 and the regions denoted by 101 and 102 by the mask formed of a silicon oxide film 14, it is subjected to an UV ozone treatment. A silicon oxide film having high denseness is formed on the surface of the exposed amorphous silicon film 103 by this UV ozone treatment.

Then a nickel acetate solution containing 10 ppm (in terms of weight) of a nickel element is applied to the entire surface by spin coating.

By coating this nickel acetate solution, the nickel element is held in contact with the surface of the amorphous silicon film 103 in the regions denoted by 108 to 110 and the regions denoted by 101 and 102. At this point, the solution is not repelled due to the hydrophilic nature of the above silicon oxide film having high denseness so that the nickel element can be held in contact with the surface of the amorphous silicon film 103.

A method for introducing the metal element using this solution is excellent in controllability and reproducibility. Instead of the above method using a solution, sputtering, plasma treatment, CVD or adsorption may be used to introduce the metal element for promoting the crystallization of silicon.

The amorphous silicon film 103 is crystallized by heating to obtain a crystalline silicon film.

In this embodiment, heating is carried out at 600° C. in a nitrogen atmosphere for 4 hours. Since the regions 108, 109 and 110 have a narrow width of 5 µm, only vertical growth as shown by 111 takes place.

In the regions 101 and 102, vertical growth takes place and also horizontal growth takes place in a direction parallel to the substrate from these regions. The horizontal growth is carried out in directions shown by arrows 104 to 107.

Here, in the regions 108 to 110, vertical growth takes place and horizontal growth as shown by 104 and 105 stops in these regions.

The vertical growth regions contain the nickel element in a relatively high concentration and an end portion of the horizontal growth region also contains the nickel element in a high concentration. Therefore, in the vertical growth regions denoted by 108 to 110 which collide with horizontal growth, the nickel element is present in an extremely high concentration.

Stated more specifically, the concentration of nickel in the regions denoted by 108 to 110 is 1- to 2-column higher than the horizontal growth regions denoted by 105 and 106 (according to a measurement by SIMS (secondary ion mass spectrometry)).

A grain boundary containing nickel silicide is formed in a portion where the vertical growth and horizontal growth collide with each other.

After the completion of crystallization, wet etching is carried out using an etchant for selectively etching silicon (e.g., nitrate fluoride consisting of HF:HNO$_3$=1:200). Then, only the vertical growth regions are selectively removed with the mask 14 formed of a silicon oxide film serving as a mask. These regions contain nickel in a high concentration as described above.

Etching is carried out with a hydrofluoric acid-based etchant (e.g., a buffer hydrofluoric acid). In this step, the mask 14 formed of a silicon oxide film is removed.

Further, patterning is made on the crystalline silicon film having horizontal growth regions or only horizontal growth regions to form an active layer of a thin-film transistor.

When horizontal growth is caused to start from the slender regions as shown in FIG. 1A, it is possible to obtain crystals grown in the same direction in regions to be used for devices. This is extremely important when a large number of devices are to be formed and the same characteristic properties thereof are to be obtained.

Embodiment 2

Figure 2:
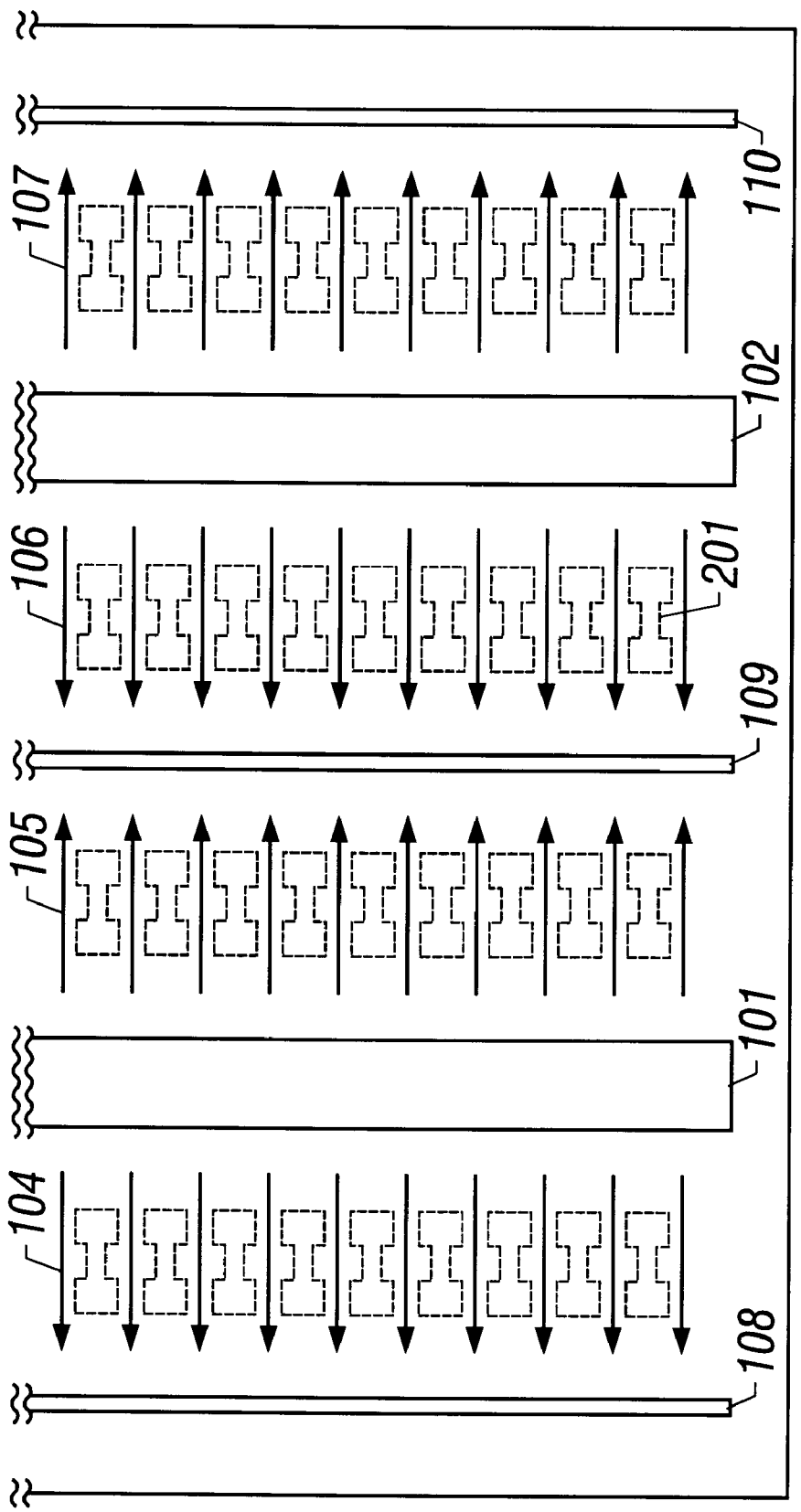

This embodiment shows an example where a large number of thin-film transistors are fabricated using the horizontal growth regions produced in Embodiment 1. FIG. 2 shows an example of the lay-out of the active layers of thin-film transistors.

In FIG. 2, denoted by 201 are the active layers of the thin-film transistors. A large number of thin-film transistors can be constituted with a crystalline silicon film grown horizontally in a predetermined direction by arranging the thin-film transistors as shown in FIG. 2. And the thin-film transistors can have the same characteristic properties.

Further, the effect of the grain boundary formed in regions where horizontal growth regions collide with each other can be eliminated by using the horizontal growth regions as horizontal growth stoppers and arranging them as shown in FIG. 2.

A thin-film transistor having high mobility can be fabricated by determining the position of the active layer of the thin-film transistor so that carriers can move in the direction of horizontal growth. This is because there is little effect of the grain boundary and the carriers can move easily in the direction of horizontal growth.

The configuration shown in this embodiment is advantageous for a peripheral driver circuit in an active matrix liquid crystal display device or active matrix EL display device.

In other words, it is extremely effective where the same circuit configurations are aligned in a horizontal directions like a shift register circuit and an analog buffer circuit.

By setting the width of a shift register circuit to 80 µm and utilizing the configuration shown in this embodiment in which a horizontal growth distance of 100 µm or more can be obtained, a shift register circuit can be formed from a single horizontal growth region. That is, it is possible to form a circuit having a predetermined function by using a region having the same crystal growth form.

By using the configuration shown in this embodiment, a circuit having a predetermined function can be provided integrally in a single horizontal growth region. This predetermined function is one or more selected from an amplifying function, switching function, impedance conversion function, flip-flop circuit, sampling circuit, sampling hold circuit, memory function and arithmetic function, in addition to the above shift register function, or a composite function thereof.

It is important for such an integrated structure having a predetermined function that all the constituent elements thereof should have the same characteristic properties. Therefore, as shown in this embodiment, it is advantageous to form such an integrated circuit within a region having the same crystal growth state.

Embodiment 3

This embodiment is directed to the production process of a thin-film transistor when it employs a configuration shown in FIG. 2.

The process shown in this embodiment is a process for producing a single thin-film transistor in each of two different adjacent horizontal growth regions. This embodiment shows an example where an N-channel thin-film transistor is fabricated.

A silicon oxide film 302 is first formed at a thickness of 3,000 Å on a glass substrate 301 as an undercoat film and then an amorphous silicon film 303 is formed to a thickness of 500 Å. Low-pressure thermal CVD is preferably used to form this amorphous silicon film 303.

A mask 304 is formed of a silicon oxide film having a thickness of 1,500 Å which is formed by plasma CVD. The etching rate of the silicon oxide film constituting the mask 304 is faster than the etching rate of the silicon oxide film 302 constituting the undercoat film.

The mask 304 may have a laminate structure consisting of a thin silicon oxide film and a silicon nitride film formed thereon to make the etching rate thereof faster than that of the undercoat film.

Thus 5 μm-wide slits 306 and 307 and a 30 μm-wide slit 305 are obtained. In this state, the amorphous silicon film 303 is exposed in these slits.

A top view of the slits is the same as that of FIG. 1(A). That is, the slits 306 and 307 correspond to the slits 108 and 109 of FIG. 1(A) and the slit 305 correspond to the slit 101 of FIG. 1(A).

Figure 3A:
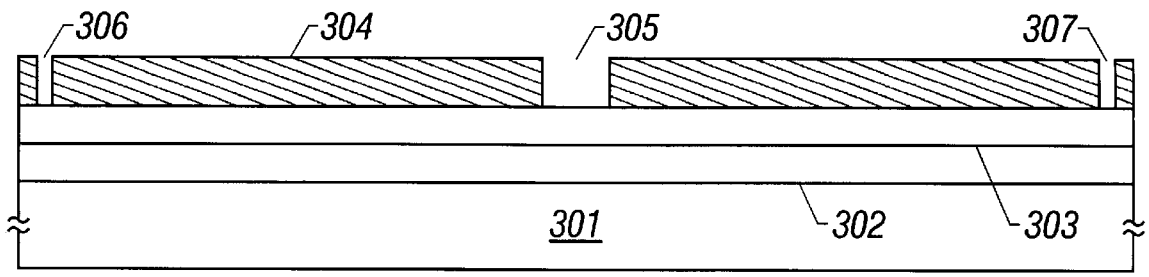

Thus, the state shown in FIG. 3(A) is obtained. A nickel acetate solution containing 10 ppm of nickel is applied by spin coating method and the nickel element is held in contact with the surface of the amorphous silicon film 303 in the regions denoted by 306, 305 and 307.

Figure 3B:
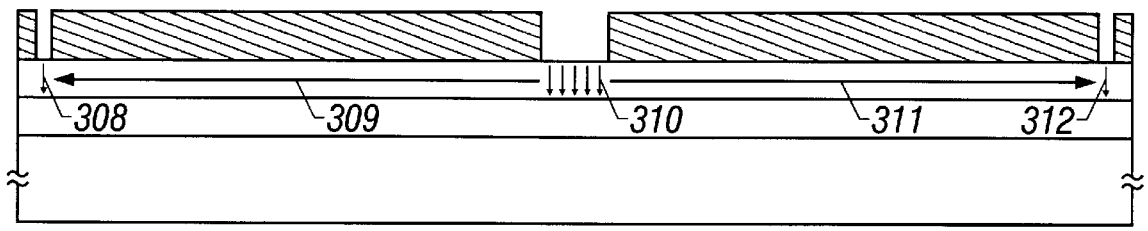

A heat treatment is carried out in a nitrogen atmosphere at 550° C. for 4 hours to grow crystals as shown in FIG. 3(B). Owing to this heat treatment, crystals are grown vertically in the regions denoted by 308, 310, 312. In regions denoted by 309 and 311, crystals are grown horizontally. (FIG. 3(B))

The vertical growth regions 308, 310 and 312 are removed by wet etching using nitrate fluoride. This step may be carried out by dry etching.

Figure 3C:
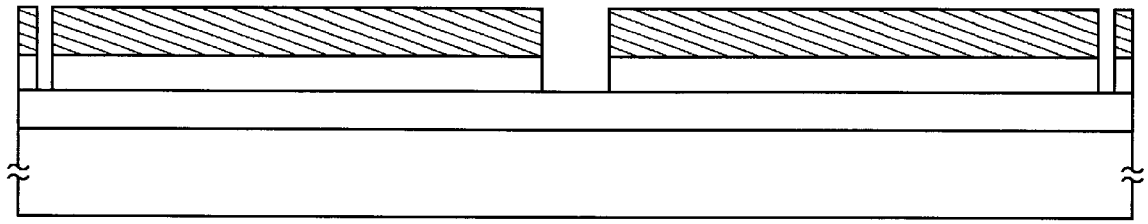

Thus, the state shown in FIG. 3(C) is obtained. Further, the residual mask 304 is removed. When the mask 304 is formed of a silicon oxide film, a buffer hydrofluoric acid is used to remove the mask 304.

Figure 3D:
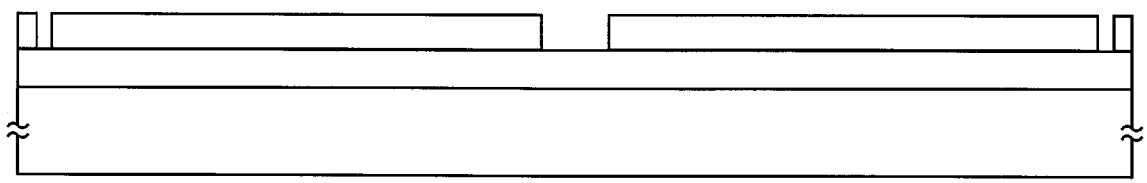
Figure 3E:
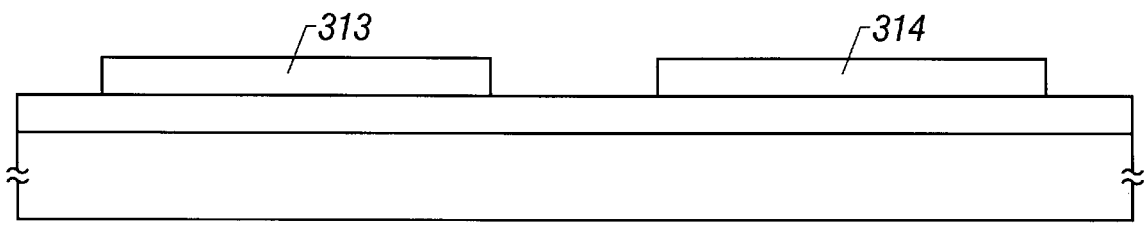

Thus, the state shown in FIG. 3(D) is obtained. Then, patterning is carried out to form the active layer of a thin-film transistor and the state shown in FIG. 3(E) is obtained. In FIG. 3(E), reference numerals 313 and 314 are patterns formed by a horizontally grown crystalline silicon film constituting the active layers of thin-film transistors.

Figure 4A:
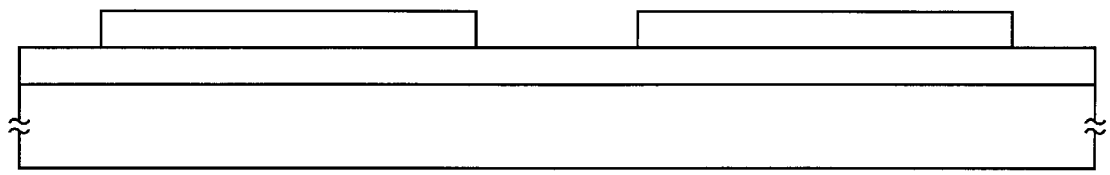

When the state shown in FIG. 3(E) (the same as FIG. 4(A)) is obtained in this way, a silicon oxide film 401 which serves as a gate insulating film is formed. This silicon oxide film 401 is formed at a thickness of 1,000 Å, for example, by plasma CVD or sputtering.

Then, an aluminum film not shown constituting gate electrodes is formed. This aluminum film is caused to contain 0.2% by weight of scandium. An fine anodic oxide film not shown is then formed at a thickness of 100 Å.

This anodic oxide film is formed by carrying out anodic oxidation in an ethylene glycol solution containing 3% of tartaric acid neutralized with ammonia water, using the aluminum film as an anode. The thickness of this fine anodic oxide film can be controlled with application voltage.

Figure 4B:
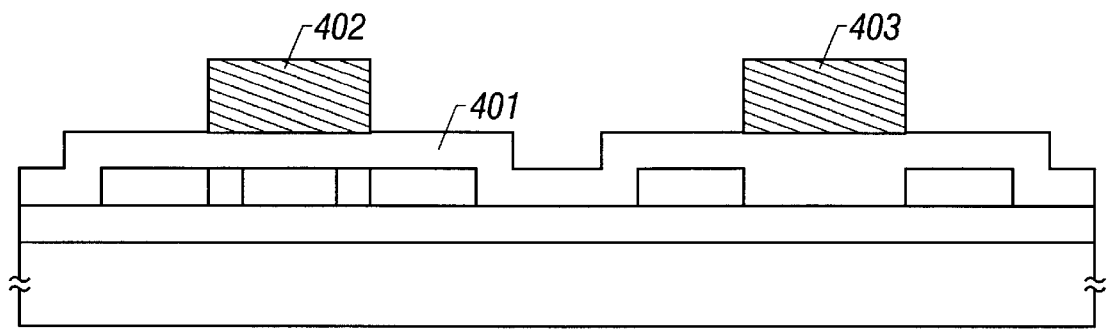

Further, patterning is made on this aluminum film to obtain the state shown in FIG. 4(B).

In the state shown in FIG. 4(B), reference numerals 402 and 403 are patterns for forming gate electrodes later.

When the state shown in FIG. 4(B) is obtained, anodic oxidation is carried out again to form porous anodic oxide films 404 and 405. This porous anodic oxide film is formed by anodic oxidation in an aqueous solution containing 3% of oxalic acid using the aluminum patterns 402 and 403 as anodes. The thickness of this anodic oxide film can be controlled by the anodic oxidation time.

Finer anodic oxide films 406 and 407 are formed under the above-described conditions. The thickness of the fine anodic oxide film should be 800. The anodic oxide films 406 and 407 are formed in the state shown in FIG. 4(C) by this anodic oxidation because an electrolyte solution enters the insides of the porous anodic oxide films 404 and 405.

When the thicknesses of the anodic oxide films 406 and 407 are 2,000 or more, off-set gate regions can be formed with the thicknesses later.

Figure 4C:
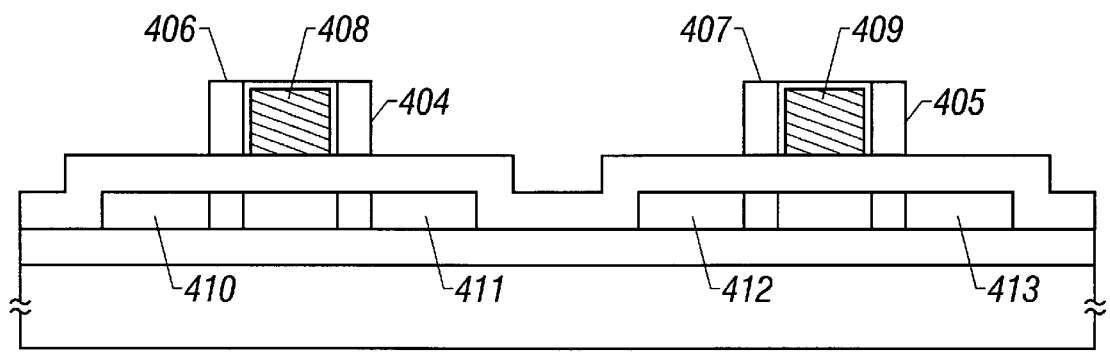

Thus, the state shown in FIG. 4(C) can be obtained. Reference numerals 408 and 409 are gate electrodes here.

Thereafter, impurity ions are implanted to form source/drain regions. In this embodiment, to fabricate an N channel thin-film transistor, P ions are implanted. Thus, the source region 410 and drain region 411 of one thin-film transistor are formed. Also, the source region 412 and drain region 413 of the other thin-film transistor are formed.

Then the porous anodic oxide films 404 and 405 are selectively etched using a mixed acid prepared by mixing phosphoric acid, acetic acid and nitric acid. Thus, the state shown in FIG. 4(D) is obtained.

Thereafter, impurity ions are implanted again. P ions are implanted in a smaller dose amount than that of the first implantation. Thus, in the one thin-film transistor, light doped regions 414 and 416 are formed. In the other thin-film transistor, light doped regions 417 and 419 are formed.

The light doped regions 416 and 419 adjacent to the drain region are called LDD (light doped drain). Reference numerals 415 and 418 are channel forming regions.

Figure 4D:
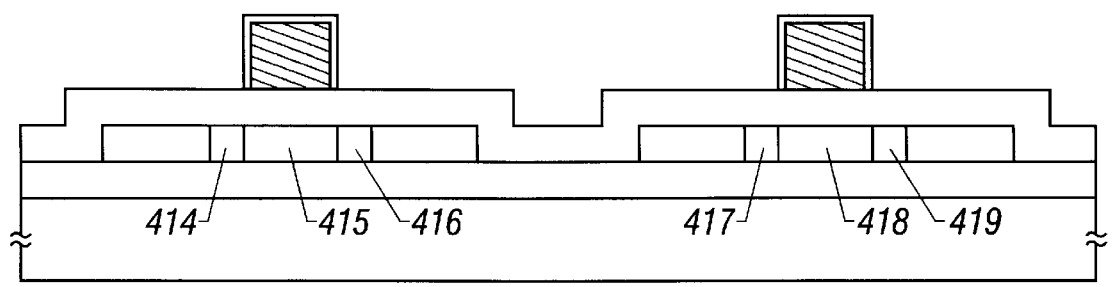
Figure 4E:
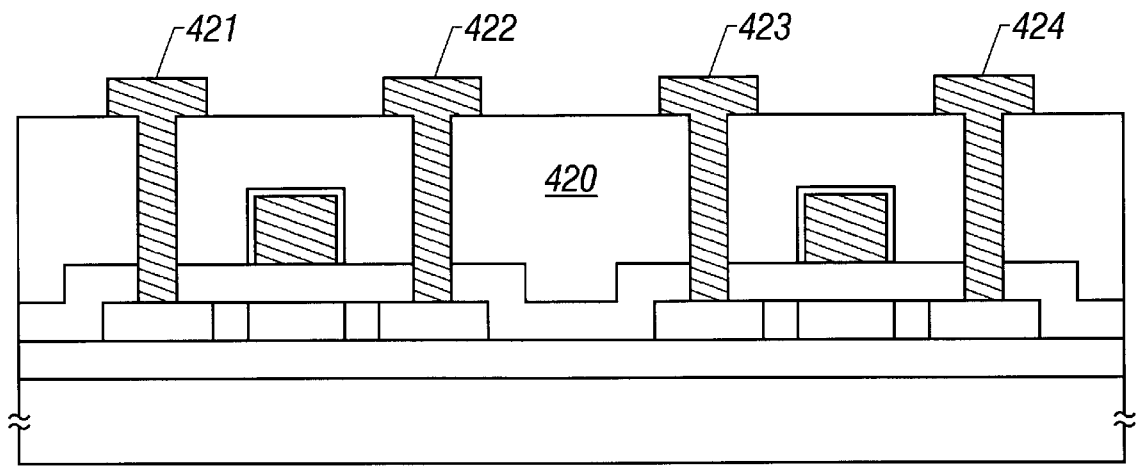

Thus, the state shown in FIG. 4(D) is obtained. An inter-layer insulating film 420 is formed of a silicon oxide film or the like. Further, contact holes are formed to provide source electrodes 421 and 423 and drain electrodes 422 and 424. (FIG. 4(E))

A pair of N channel thin-film transistors are formed in this embodiment. However, a large number of thin-film transistors are actually formed and arranged, as shown in FIG. 2, in a rear direction or front direction of the figure.

A metal element for promoting the crystallization of silicon is held in contact with the surface of an amorphous silicon film in this embodiment. However, the metal element may be held in contact with the surface of an undercoat film in a predetermined pattern before the formation of an amorphous silicon film.

Embodiment 4

This embodiment is directed to a technique for reducing the concentration of a metal element for promoting the crystallization of silicon which remains in the end. As a matter of course, this embodiment has significance as explained in Example 1.

Figure 5A:
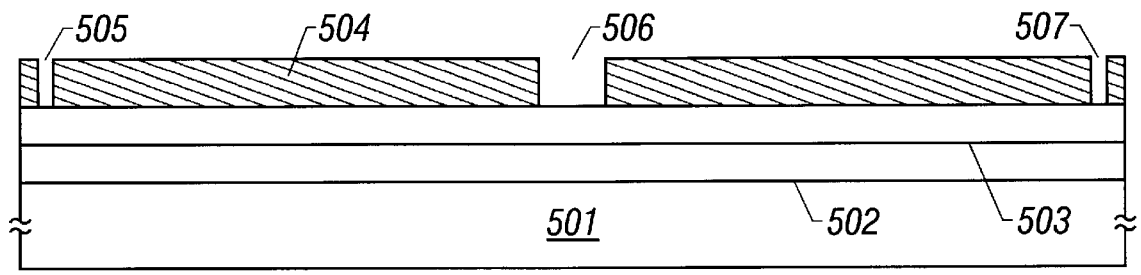

In a configuration shown in this embodiment, a silicon oxide film 502 is first formed at a thickness of 3,000 Å on a glass substrate (e.g., Corning 1737 glass substrate) 501 as an undercoat film as shown in FIG. 5(A).

Thereafter, an amorphous silicon film 503 is formed at a thickness of 500 by plasma CVD or low-pressure thermal CVD.

Further, an silicon oxide film not shown having a thickness of 1,500 Å is formed. This silicon oxide film functions as a mask in the introduction of the nickel element in a later step.

Although an example where a silicon oxide film is used is shown in this embodiment, a silicon nitride film, silicon oxynitride film, metal film or metal silicide may be used. It is desirable that the film which serves as the mask should not react with silicon during heating for crystallization and the metal element for promoting the crystallization of silicon should have an extremely small diffusion coefficient for the silicon film.

Patterning is made on this silicon oxide film to form a mask 504. It is desirable that this silicon oxide film should have a faster etching rate than the silicon oxide film 502 as an undercoat film.

The mask 504 which is formed of this silicon oxide film has slits 505 to 507 which extend in a longitudinal direction, i.e., a rear direction of the figure. The widths of the slits 505 to 507 should be 3 $\mu$m. The width of the slit in the region denoted by 506 should be 20 $\mu$m.

Thus, the state shown in FIG. 5(A) is obtained. In this state, UV ozone oxidation is carried out to form a fine oxide film on the surface of the exposed amorphous silicon film. This oxide film serves to improve the wettability of a nickel acetate solution to be coated later.

Then, the nickel acetate solution having a nickel concentration (in terms of weight) of 10 ppm is applied by spin coating.

Figure 5B:
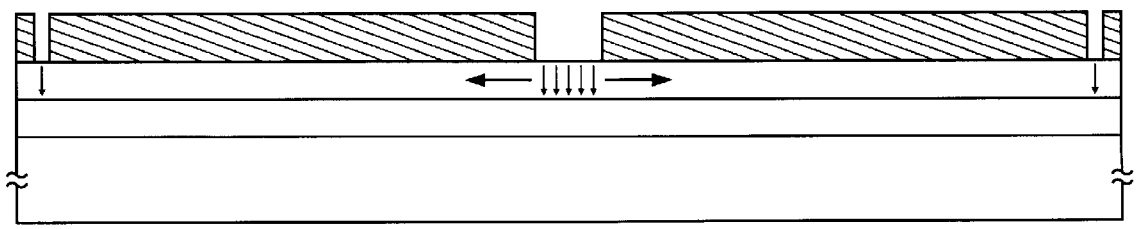

In this state, a heat treatment is carried out at 580° C. for 1 hour. This heat treatment is carried out under the condition that horizontal growth of 20 to 30 $\mu$m takes place. Owing to this heat treatment, crystals are grown downward in a vertical direction from the surface of the silicon film in the regions 505, 506 and 507 as shown in FIG. 5(B). Also, crystals are grown 20 to 30 $\mu$m horizontally in directions parallel to the substrate from the region 506.

The above heat treatment may be carried out by heating at 500 to 600 C. for 10 to 240 minutes (2 hours). If the heating temperature is higher and the heating time is longer than the above conditions, crystal growth will proceed too much and second-stage crystal growth to be described later will be difficult.

As a result of this crystal growth, the regions 505 to 507 where vertical growth took place become vertical growth regions which have crystallinity and a high concentration of the nickel element. The regions horizontally grown from the region 506 also have a high concentration of the nickel element. (FIG. 5(B))

According to a measurement by SIMS (secondary ion mass spectrometry), the average concentration of nickel in the vertical growth regions denoted by 505 to 507 is about $5 \times 10^{18}$ cm$^{-3}$. The average concentration of nickel in the regions horizontally grown from the region 507 is in the order of $10^{18}$ cm$^{-3}$.

Thereafter, the vertical growth regions are removed using nitrate fluoride. Then, the mask 504 formed from silicon oxide is removed by etching with a hydrofluoric acid-based etchant (for example, a buffer hydrofluoric acid).

Figure 5C:
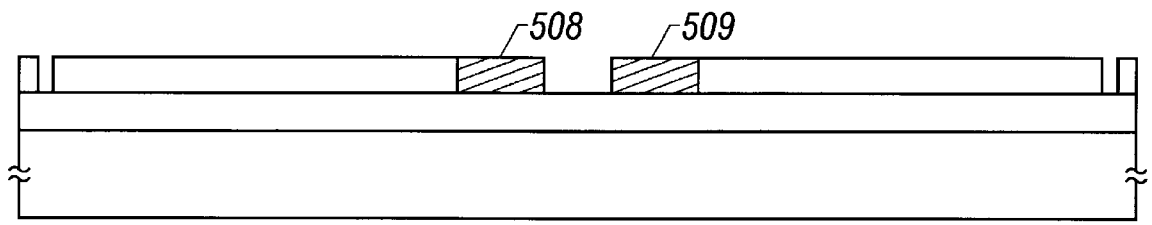

Thus, the state shown in FIG. 5(C) is obtained. Reference numerals 508 and 509 are the horizontal growth regions having a high concentration of the nickel element. The regions denoted by 508 and 509 experience horizontal growth and have crystallinity. The other regions remain amorphous. This is because an ordinary amorphous silicon film is not crystallized by 1 hour of a heat treatment at 580° C.

When the state shown in FIG. 5(C) is obtained, a heat treatment is carried out again. This heat treatment is intended to render second-stage crystal growth. This heat treatment is carried out at 600 C. for 4 hours.

Figure 5D:
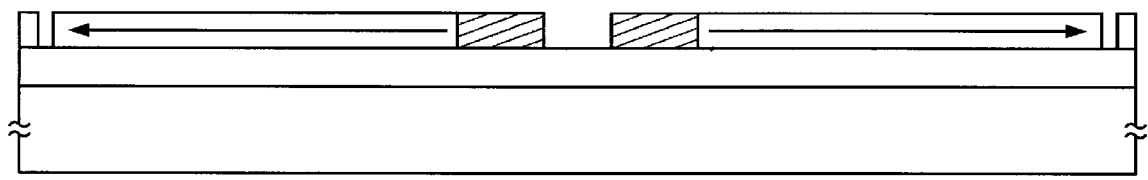
Figure 5E:
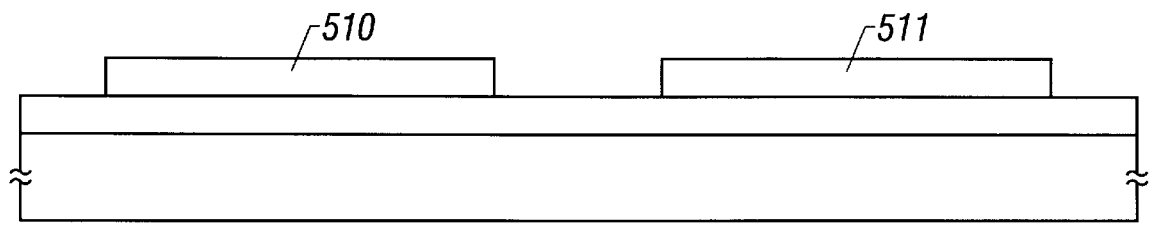

As a result of this step, crystal growth (horizontal growth) starts again from the regions denoted by 508 and 509. This crystal growth state is shown in FIG. 5(D). This crystal growth stops in the regions 505 and 507 which have been removed previously. Thus, the regions of slender crystalline silicon films having the same crystal growth form can be obtained (see FIG. 1(A)).

The thus obtained crystalline silicon film can have a nickel concentration in the order of $10^{17}$ cm$^{-3}$. This value is about one-column lower than the value obtained by the first-step crystal growth method shown in Embodiment 1. This is extremely advantageous when the stability and reproducibility of a device are taken into consideration.

Thereafter, patterning is made on the thus obtained crystalline silicon film as shown by 510 and 511 to form active layers of thin-film transistors.

In the fabrication of a device, it is recommended to avoid the regions denoted by 508 and 509. That is, it is preferred that the regions 508 and 509 be removed and the other regions be used to fabricate a device. This is because the regions 508 and 509 contain the nickel element in a relatively high concentration.

By utilizing the configuration shown in this embodiment, the horizontal growth regions from which high characteristic properties can be obtained can be used and the nickel concentration (metal element concentration) of the regions can be suppressed to $1 \times 10^{17}$ to $5 \times 10^{18}$ cm$^{-3}$.

Especially by optimizing the conditions, the concentration of nickel (metal element concentration) contained in the active layer of a thin-film transistor can be easily suppressed to a level of $1 \times 10^{17}$ cm$^{-3}$.

This is advantageous when a device having high characteristic properties and high reliability is to be obtained.

Embodiment 5

This embodiment is directed to the configuration of an active matrix liquid crystal display device in which a peripheral driver circuit is integrated on the same substrate as an active matrix circuit.

In such a configuration as described above, since fast operation is required for the peripheral driver circuit, a thin-film transistor making use of horizontal growth is suitable. On the other hand, since a thin-film transistor for use in an active matrix circuit does not require so high mobility but low leak current characteristics, it is desirable that the thin-film transistor should have low mobility characteristics (about 10 cm$^2$/Vs). (Generally speaking, as mobility increases, the leak current grows.)

Then, in this embodiment, the peripheral driver circuit is formed in a horizontal growth region using a technique shown in FIGS. 1(A) and 1(B), FIG. 2 and further FIGS. 5(A) to 5(E). That is, the active layer of a thin-film transistor constituting the peripheral driver circuit is formed of a horizontally grown crystalline silicon film. Owing to this configuration, the peripheral driver circuit can be constituted by a thin-film transistor having high mobility.

Since the peripheral driver circuit has high integration, it is extremely advantageous to use the technique shown in FIG. 1, FIG. 2 and further FIG. 5.

The thin-film transistor to be provided in the active matrix circuit is formed using a crystalline silicon film which is obtained without using nickel. This is because low leak current characteristics are requisite for the active matrix circuit.

According to experiments, it has been observed that a thin-film transistor which is produced using a crystalline silicon film which is obtained by using a nickel element has a higher leak current value than a thin-film transistor which is produced using a crystalline silicon film obtained solely by heating without using a nickel element or by illumination with laser light. It is considered that this is because nickel becomes a trap level.

Even though crystallinity is slightly low and high mobility cannot be obtained, a thin-film transistor which suppresses an increase in leak current (OFF current) without using the nickel element is used in an active matrix circuit. This thin-film transistor to be provided in the active matrix circuit (pixel circuit) is produced using a crystalline silicon film obtained by illumination with laser light.

An active matrix type liquid crystal display device in which a peripheral circuit is constituted by a thin-film transistor capable of high-speed operation and a pixel matrix region is constituted by a thin-film transistor having low leak current characteristics can be obtained by employing the configuration shown in this embodiment.

The configuration shown in this embodiment can be applied to other active matrix flat panel displays, such as a plasma display and an EL display.

To realize the configuration shown in this embodiment, an annealing step using laser light illumination may be carried out after the heating step for horizontal growth.

The heating step for horizontal growth is carried out at 600° C. for 4 hours, for example. The amorphous silicon film which does not contain nickel (or other metal element for promoting the crystallization of silicon) is not crystallized by this step alone.

However, the crystallization of the horizontal growth region is accelerated, the quality of the resulting film is stabilized and the amorphous region (this is the region to which nickel is not added) which has not been crystallized by heating can be crystallized by using laser light illumination as well.

At this point, laser light illumination conditions are optimized to ensure that the mobility of a thin-film transistor obtained by using no nickel-added regions is about 10 cm$^2$/Vs for an N channel type.

Although the crystallization of the amorphous silicon film by illumination with laser light has a problem with the reproducibility of its effect, high reproducibility can be obtained under relatively light annealing conditions as described above.

Thus, a thin-film transistor having low current characteristics obtained by laser annealing can be arranged mainly in a pixel matrix region and a thin-film transistor having high mobility (average of about 100 cm$^2$/Vs as will be described later) using horizontal growth can be arranged in a peripheral circuit region.

Embodiment 6

This embodiment is directed to a technique for forming a marker for alignment without adding a special step. In the fabrication of a thin-film transistor, it is necessary to align a mask for the formation of gate electrodes, contact holes, and source/drain electrodes. At this time, a marker for this alignment is required.

It is desirable that the marker for alignment should be formed in the step which requires alignment for the first time.

Then, in the configuration shown in this embodiment, the formation of this marker is carried out simultaneously with the formation of a mask 14 shown in FIG. 1.

In this embodiment, a nickel element (or other appropriate metal element for promoting the crystallization of silicon) is introduced into a pattern of the marker. That is, the pattern of the marker for alignment is formed in part of the mark 14 which is formed of a silicon oxide film.

Further, vertical growth is carried out on this pattern by heat treatment. This pattern is removed by etching simultaneously with the removal of the mask 14. Thus, a region which has been etched to a predetermined pattern is obtained. This pattern can be advantageously obtained without adding a new step.

Embodiment 7

In this embodiment, the result of investigation is shown on the relationship between the distance of horizontal growth and heating conditions. The production conditions of samples are first described.

First, a Corning 1737 glass substrate is heated in a nitrogen atmosphere at 640° C. for 2 hours. This is intended to suppress the shrinkage of the glass substrate in the subsequent step.

Next, a silicon oxide film is deposited at a thickness of 2,000 Å as an undercoat film by plasma CVD using a TEOS gas. An amorphous silicon film is further formed to a thickness of 500 Å by plasma CVD. Å@Also, a silicon oxide film for a mask which is used to introduce a nickel element is formed by plasma CVD using a TEOS gas.

Patterning is made on this silicon oxide film to form a nickel element-added pattern. The width of this pattern should be 20 $\mu$m and a slit-shaped opening is formed in this pattern.

An extremely thin oxide film is formed on the surface of the exposed amorphous silicon film by UV ozone oxidation. The oxide film is then heated in a nitrogen atmosphere. As a result of this heat treatment, crystals are grown (horizontal growth) from the nickel element-added region in a direction parallel to the substrate. The results are shown in Table 2 below.

TABLE 2

The temperature dependency of the lateral growth distance ($\mu$m)

|  | 1 hr | 2 hr | 4 hr | 8 hr |
| --- | --- | --- | --- | --- |
| 550° C. | 10 | 18 | 36 | 70 |
| 600° C. | 29 | 55 | 110 | 215 |

As shown in Table 2 above, the distance of horizontal growth can be extended by increasing the heating temperature and the heating time. However, when the heating temperature is 600° C., crystallization not caused by nickel proceeds by 8 hours or more of heating.

This crystallization not caused by nickel has a function to stop the horizontal growth as well as the vertical growth. Therefore, when the heating temperature is set at 600° C. or more, it is preferred to shorten the heating time.

In any case, a horizontal growth distance of about 200 $\mu$m is obtained. Therefore, when the nickel element-added region is made long and narrow (for example, the region denoted by 101 in FIG. 1), a long and narrow horizontal growth region having a width of 200 $\mu$m and a desired length can be obtained.

This horizontal growth region has an uniform crystal growth state. For example, according to a measurement by X-ray diffraction, substantially the same signal strength ratio of each crystal orientation can be obtained. This means that this state makes it possible to form devices having the same characteristics within the region. Therefore, it can be said that the region is extremely preferred.

Embodiment 8

This embodiment is directed to a configuration for selectively changing the length of horizontal growth. As is understood from Table 1 described above, the distance of horizontal growth differs according to the width of a nickel-added region. Utilizing this fact, a different amount of horizontal growth (length of horizontal growth) is obtained in this embodiment.

For instance, by changing the width of an added region shaped like a slit, the growth distance of the horizontal growth region where crystals are grown from this added region can be controlled.

Embodiment 9

This embodiment shows a case where a thin-film transistor to be arranged in each pixel is formed with a horizontal growth region in an active matrix configuration. When the pixel pitch is narrow at 50 μm or less in an active matrix liquid crystal display device or EL display device, adjacent horizontal growth regions may collide with each other or impede mutual crystal growth, or a grain boundary may be formed in a thin-film transistor forming section in some cases.

To eliminate this state and form a horizontal growth region in the predetermined region of each pixel, the above-mentioned vertical growth region is used as a horizontal growth stopper.

That is, in order to form a horizontal growth region only in a predetermined region, a slit-shaped vertical growth region having a width of 5 μm or less (for example, 3 μm) is formed. Owing to this, a horizontal growth region can be formed in the predetermined region and the occurrence of the above-mentioned defects can be suppressed. That is, the horizontal growth region can be formed with high controllability.

Embodiment 10

This embodiment is directed to a configuration in which a crystalline silicon film obtained by heat treatment is further irradiated with laser light in order to increase a process margin. When a crystalline silicon film is obtained by heating using the invention disclosed in this specification, there is not a few fluctuation in the quality of the film.

In this embodiment, to eliminate this fluctuation, the film is again annealed by illumination with laser light. As laser light, it is desired to use an excimer laser having a wavelength of ultraviolet region.

As shown in this embodiment, the quality of the obtained crystalline silicon film can be made uniform by using laser light illumination in combination. Optical annealing may be carried out by illuminating with strong light such as infrared light or ultraviolet light in place of laser light.

Embodiment 11

This embodiment shows the comparative example of characteristic properties between a thin-film transistor obtained by using a horizontal growth region and a thin-film transistor obtained by using a vertical growth region.

Table 3 below shows values of mobility of 18 samples selected at random from obtained N-channel thin-film transistors.

TABLE 3

| unit: $cm^2/Vs$ | |
|---|---|
| A | B |
| 75.3 | 95.5 |
| 75.4 | 100.1 |
| 70.2 | 108.3 |
| 80.7 | 102.0 |
| 81.8 | 106.4 |
| 90.3 | 106.0 |
| 89.6 | 104.7 |
| 84.0 | 95.6 |
| 90.5 | 106.2 |
| 91.4 | 104.0 |
| 92.3 | 103.2 |
| 90.1 | 103.6 |
| 92.4 | 104.2 |
| 94.8 | 101.6 |
| 95.2 | 104.5 |
| 95.8 | 101.6 |
| 101.8 | 98.5 |
| 100.8 | 100.7 |

As is apparent from Table 3, thin-film transistors obtained by using vertical growth as listed in column A have a mobility in a wide range of 75 to 101 $cm^2/Vs$. On the other hand, the thin-film transistors using horizontal growth as listed in column B have high mobility values which are within an extremely narrow range.

That is, when horizontal growth is utilized, the characteristics of a device itself are high and fluctuations in the characteristics are made small.

The crystalline silicon film having the above data was obtained by crystallizing by heating at 600° C. for 4 hours using nickel as a metal element for promoting the crystallization of silicon and by illumination with light emitted from a KrF excimer laser at an irradiation energy density of 250 $mJ/cm^2$.

For comparison, there is shown a case where samples obtained without using nickel were supplied in the same lot as the above process. In this case, the samples are not crystallized by heat treatment as a matter of course. However, they can be crystallized into a crystalline silicon film by illumination with laser light.

An N channel thin-film transistor produced using this sample had a mobility of 10 $cm^2/Vs$ or less. This low-mobility thin-film transistor is the most suitable for an active matrix region of a liquid crystal display device because it does not use nickel.

For comparison, a similar N channel thin-film transistor was fabricated using a crystalline silicon film obtained only by heating at 640° C. for 48 hours (without using nickel). In this case, the thin-film transistor had a mobility of 20 to 30 $cm^2/Vs$. The significance of using horizontal growth is understood from this fact.

In the case of a P channel type, the mobility thereof is smaller by about 30%, but similar thin-film transistor as shown in Table 3 were obtained as a whole.

Embodiment 11

This embodiment is directed to a case where regions having the same crystal growth form as shown in FIG. 1 are used to form a circuit having a predetermined function.

Figure 6:
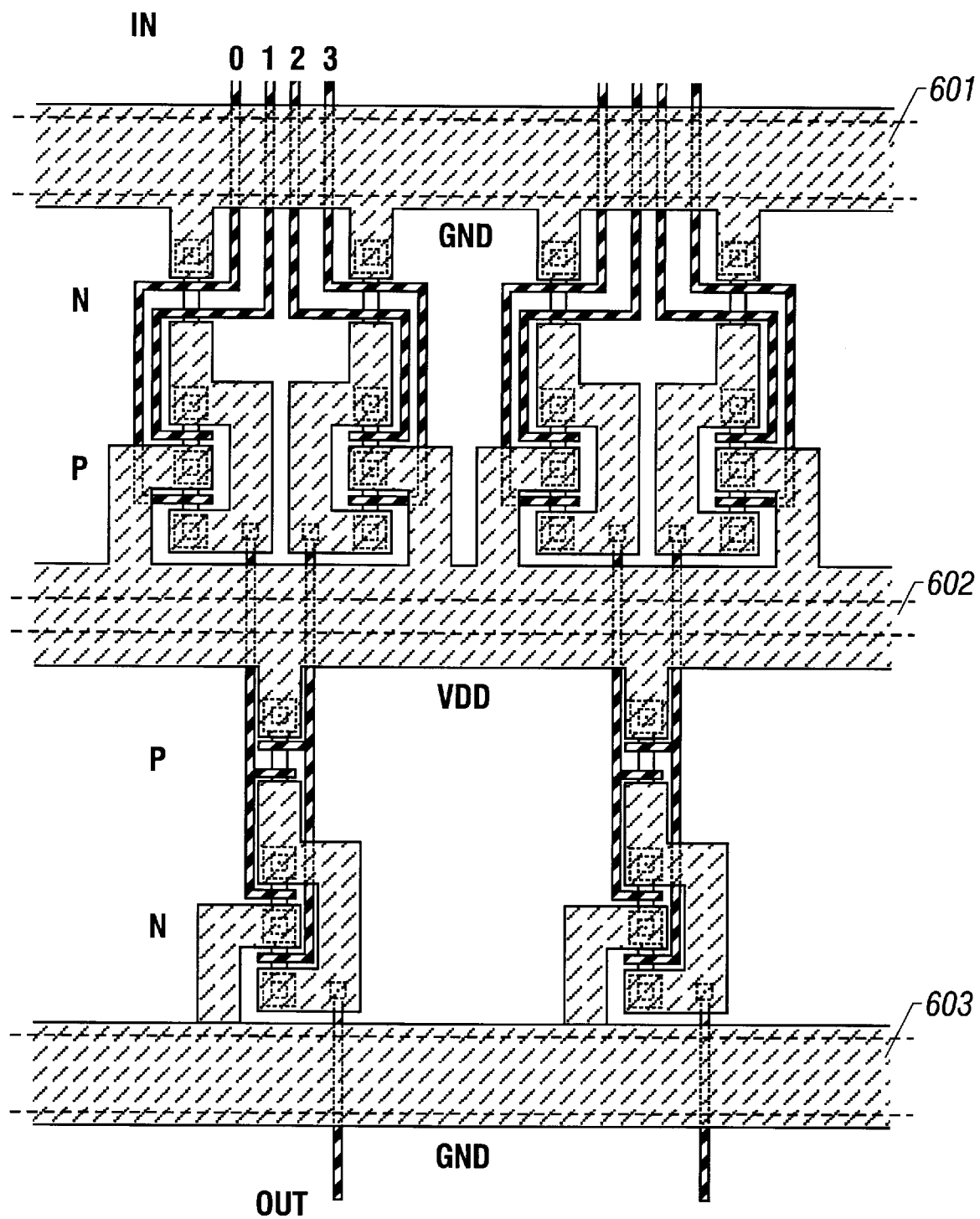
Figure 7:
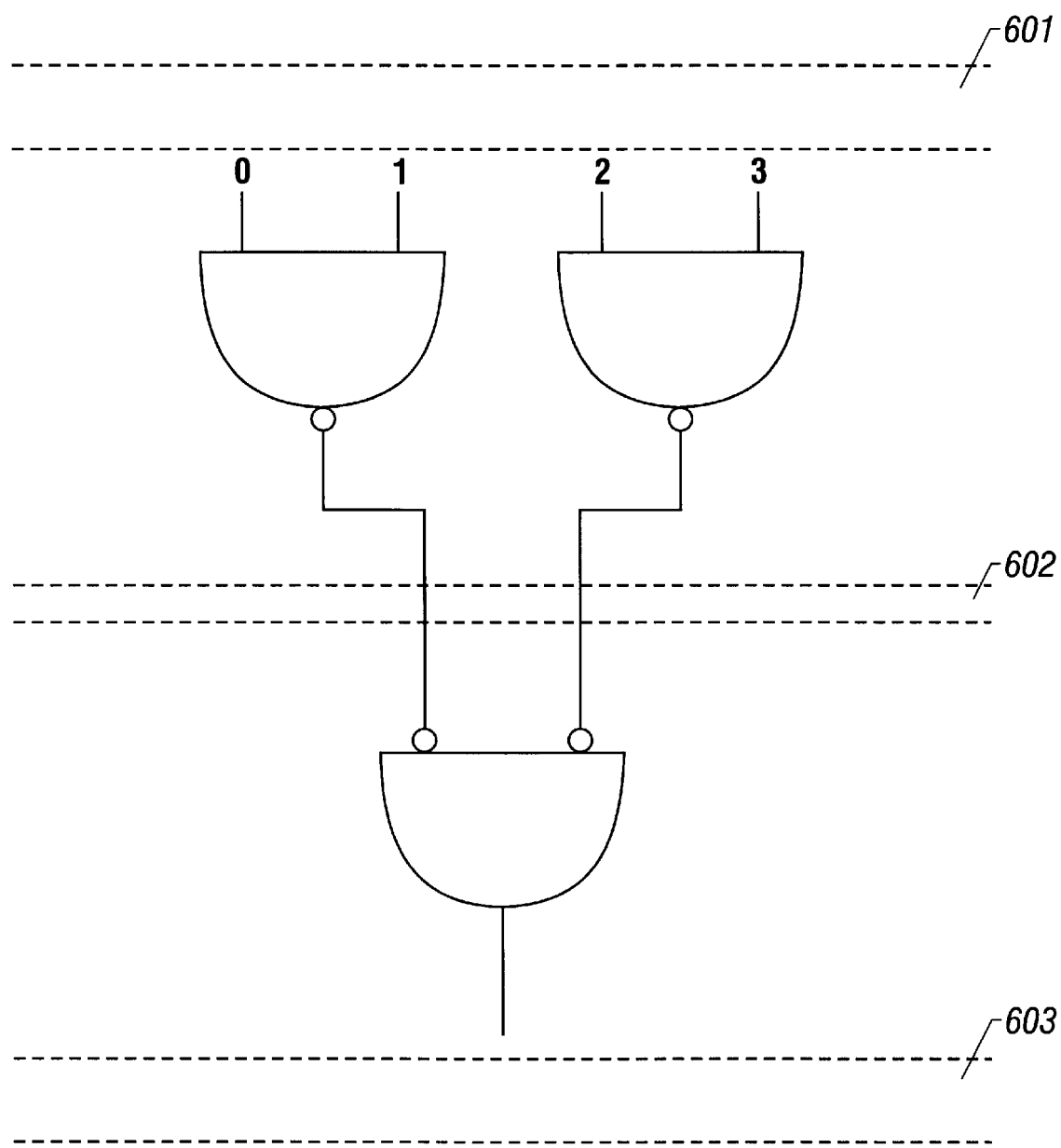

This embodiment shows part of a decoder circuit. FIG. 6 shows an actual circuit pattern. FIG. 7 is an electronic circuit block diagram.

In FIGS. 6 and 7, reference numerals 601 and 603 are regions to which nickel is added and from which horizontal growth starts. That is, they correspond to the regions 101 and 102 in FIG. 1.

Reference numeral 602 is a region which has a width of 5 $\mu$m or less and serves as a stopper for stopping horizontal growth.

As is apparent from FIGS. 6 and 7, two NAND circuits are formed using a region which has the same crystal growth form and in which crystals are grown horizontally from the region 601. Further, a single NOR circuit is formed using a region which has the same crystal growth form and in which crystals are grown from the region 603.

In this configuration, two horizontal growth regions are intercepted by the region denoted by 602 so that they do not affect each other.

In this way, the characteristics of each circuit can be increased and total reliability can be improved.

Utilizing the invention disclosed in this specification, horizontal growth regions can be obtained with high controllability.

For instance, the growth width of the horizontal growth region can be controlled. Further, a crystal growth technique which uses a metal element for promoting the crystallization of silicon can be easily applied to a configuration which requires a fine circuit pattern.

Moreover, in a configuration for starting horizontal growth from a predetermined region of an amorphous silicon film, a circuit having a predetermined function can be formed using a horizontal growth region having the same crystal growth form by utilizing a vertical growth region as a stopper for horizontal growth.

Since the characteristics of formed devices can be made the same in this region, the characteristics and reliability of a formed circuit can be improved.

The display device manufactured in accordance with the present invention is suitable for the display device of various electronic devices, for example, a video camera, a digital camera, computer, portable data terminal, or an electronic navigation aid for vehicles. It is particularly advantageous to form on a same substrate in addition to an active matrix circuit, such thin film circuits as an inverter circuit, a buffer circuit, a switch circuit, a decoder circuit, a shift-register circuit, a sampling circuit, a sample-hold circuit, a flip-flop circuit, a computing circuit, and/or a memory circuit by utilizing the method of the present invention in order to reduce the size of the devices.

While the present invention has been described with reference to the preferred embodiments, the present invention should not be limited to those particular examples of the invention. Various modifications may be made within the scope of the appended claims.

What is claimed is:

1. A method of manufacturing semiconductor device comprising the steps of:

selectively disposing a metal element for accelerating the crystallization of silicon in contact with selected regions of a non-single crystal silicon film;

heating to grow crystals in a direction perpendicular or substantially perpendicular to the surface of the silicon film in said selected regions and grow crystals in a direction parallel or substantially parallel to the surface of the silicon film from at least one of said selected regions; and removing said selected regions of the silicon film, wherein at least another one of said selected regions of the silicon film is used as a stopper at which the crystal growth in the direction parallel or substantially parallel to the surface of the silicon film stops.

2. A method of manufacturing a semiconductor device according to claim 1, wherein the metal element for accelerating the crystallization of silicon is one or a plurality elements selected from Fe, Co, Ni, Ru, Rh, Pd, Os, Ir, Pt, Cu and Au.

3. A method of manufacturing a semiconductor device according to claim 1, wherein said regions are in a slit form and the region used as said stopper has a width of 5 $\mu$m or less.

4. A method of manufacturing a semiconductor device comprising the steps of:

selectively holding a metal element for accelerating the crystallization of silicon in contact with selected regions of a non-single crystalline silicon film;

heating to grow crystals in a direction perpendicular or substantially perpendicular to the surface of the silicon film in said selected regions and grow crystals in a direction parallel or substantially parallel to the surface of the silicon film from at least one of selected regions at the same time;

removing said selected regions of the silicon film; and then heating to grow crystals in a direction parallel or substantially parallel to the surface of the silicon film from the region where crystals are grown in a direction parallel or substantially parallel to the surface of the silicon film.

5. A method of manufacturing a semiconductor device according to claim 4, wherein the metal element for accelerating the crystallization of silicon is one or a plurality elements selected from Fe, Co, Ni, Ru, Rh, Pd, Os, Ir, Pt, Cu and Au.

* * * * *

UNITED STATES PATENT AND TRADEMARK OFFICE
CERTIFICATE OF CORRECTION

PATENT NO. : 5,922,125
DATED : July 13, 1999
INVENTOR(S) : Hongyong Zhang

It is certified that error appears in the above-identified patent and that said Letters Patent is hereby corrected as shown below:

Substitute the attached drawings for sheets 4 and 7.

Signed and Sealed this

Eighteenth Day of September, 2001

*Attest:*

*Attesting Officer*

NICHOLAS P. GODICI
*Acting Director of the United States Patent and Trademark Office*